US012744072B2

(12) United States Patent
Jannabhatla et al.

(10) Patent No.: US 12,744,072 B2
(45) Date of Patent: Sep. 22, 2026

(54) MANAGING RACE CONDITIONS FOR DRAM SELF-REFRESH

(71) Applicant: QUALCOMM INCORPORATED, San Diego, CA (US)

(72) Inventors: Sri Ananda Sai Jannabhatla, Hyderabad (IN); T S S Sai Prasad Bezawada, Tenali (IN); Subham Panda, Balasore (IN); Dinesh Nagjibhai Sudani, Amreli (IN); Radhakrishna Mugada, Hyderabad (IN); Trang Nguyen, San Diego, CA (US)

(73) Assignee: Qualcomm Incorporated

( * ) Notice: Subject to any disclaimer, the term of this patent is extended or adjusted under 35 U.S.C. 154(b) by 151 days.

(21) Appl. No.: 18/753,528

(22) Filed: Jun. 25, 2024

(65) Prior Publication Data

US 2025/0391458 A1 Dec. 25, 2025

(51) Int. Cl.
*G11C 11/406* (2006.01)

(52) U.S. Cl.
CPC .............................. *G11C 11/40615* (2013.01)

(58) Field of Classification Search
CPC ............................................... G11C 11/40615
See application file for complete search history.

(56) References Cited

U.S. PATENT DOCUMENTS 6,324,113 B1 * 11/2001 Tomita .................. G11C 11/406 365/205
2005/0005069 A1 * 1/2005 Au ...................... G11C 7/1078 711/131
2005/0052941 A1 * 3/2005 Nakamura .......... G11C 11/4076 365/232
2024/0203476 A1 * 6/2024 Sethi ................. G11C 11/40611
2024/0331794 A1 10/2024 Suzuki et al.
2025/0224884 A1 * 7/2025 Uribe .................... G06F 3/0673

* cited by examiner

*Primary Examiner* — Min Huang
(74) *Attorney, Agent, or Firm* — Gerald P. Joyce, III

(57) ABSTRACT

Aspects of entry into self-refresh mode by a dynamic random-access memory (DRAM) may be managed using one or more polled registers. Indications of DRAM write activity by the DRAM or a DRAM client may be stored in the registers. The registers may be polled after entry into DRAM self-refresh mode is initiated. The DRAM's entry into self-refresh mode may not be allowed until the registers indicate absence of DRAM write activity.

17 Claims, 6 Drawing Sheets

MANAGING RACE CONDITIONS FOR DRAM SELF-REFRESH

DESCRIPTION OF THE RELATED ART

Dynamic random access memory (DRAM) may be included in a wide variety of computing devices. To maintain data integrity, the capacitance-based cells of a DRAM data storage array must be periodically recharged or "refreshed." Such refresh operations are generally controlled by the memory (DRAM) controller. Some types of DRAM have a mode known as self-refresh, in which the DRAM refreshes the storage array independently of the DRAM controller, DRAM physical interface, and external clock signal. Self-refresh mode may be utilized to save power while preserving the stored data when the DRAM is not accessed for a substantial amount of time. For example, the DRAM may be placed in self-refresh mode when the computing device enters a low-power or "sleep" state. Self-refresh mode may also be utilized in scenarios such as abnormal resets and faults.

Before the DRAM is placed in self-refresh mode, various processing subsystems of the computing device may save data to the DRAM. For some write transactions, the DRAM controller must generate associated metadata, such as error-correcting code (ECC) metadata, and then write the metadata to a designated metadata region of the DRAM array along with writing the associated data. A race condition may occur where, for example, the DRAM controller has calculated the ECC metadata and written it to the metadata region of the DRAM, but the DRAM enters self-refresh mode before the DRAM controller can complete writing the associated data to the data region of the DRAM. In such a scenario, when self-refresh mode is exited and the saved data and associated ECC metadata are read from the DRAM, there may be a mis-match between some of the data and ECC metadata. It would be desirable to avoid such race conditions.

SUMMARY OF THE DISCLOSURE

Systems, methods, and other examples of managing aspects of entry into self-refresh mode by a dynamic random-access memory (DRAM) are disclosed.

An exemplary system for managing DRAM self-refresh may include polling circuitry and at least one register. The one or more registers may be configured to store indications of DRAM subsystem write activity associated with a DRAM client subsystem. The polling circuitry may be configured to detect initiation of DRAM self-refresh mode entry. The polling circuitry may also be configured to poll the one or more registers in response to the initiation of DRAM self-refresh mode entry. The polling circuitry may further be configured to prevent entry into DRAM self-refresh mode while a register indicates DRAM subsystem write activity associated with the DRAM client subsystem.

An exemplary method for managing DRAM self-refresh may include storing, by at least one register, at least one indication of DRAM subsystem write activity associated with a DRAM client subsystem. The method may also include detecting, by polling circuitry, initiation of DRAM self-refresh mode entry. The method may further include polling, by the polling circuitry, one or more registers in response to the initiation of DRAM self-refresh mode entry. The method may yet further include preventing entry into DRAM self-refresh mode while a register indicates DRAM subsystem write activity associated with the DRAM client subsystem.

Another exemplary system for managing DRAM self-refresh may include means for storing at least one indication of DRAM subsystem write activity associated with a DRAM client subsystem. The system may also include means for detecting initiation of DRAM self-refresh mode entry. The system may further include means for polling one or more registers in response to the initiation of DRAM self-refresh mode entry. The system may yet further include means for preventing entry into DRAM self-refresh mode while the means for storing indicates DRAM subsystem write activity associated with the DRAM client subsystem.

BRIEF DESCRIPTION OF THE DRAWINGS

In the Figures, like reference numerals refer to like parts throughout the various views unless otherwise indicated. For reference numerals with letter character designations such as "101A" or "101B", the letter character designations may differentiate two like parts or elements present in the same Figure. Letter character designations for reference numerals may be omitted when it is intended that a reference numeral encompass all parts having the same reference numeral in all Figures.

DETAILED DESCRIPTION

The word "exemplary" is used herein to mean "serving as an example, instance, or illustration." The word "illustrative" may be used herein synonymously with "exemplary." Any aspect described herein as "exemplary" is not necessarily to be construed as preferred or advantageous over other aspects.

Figure 1:
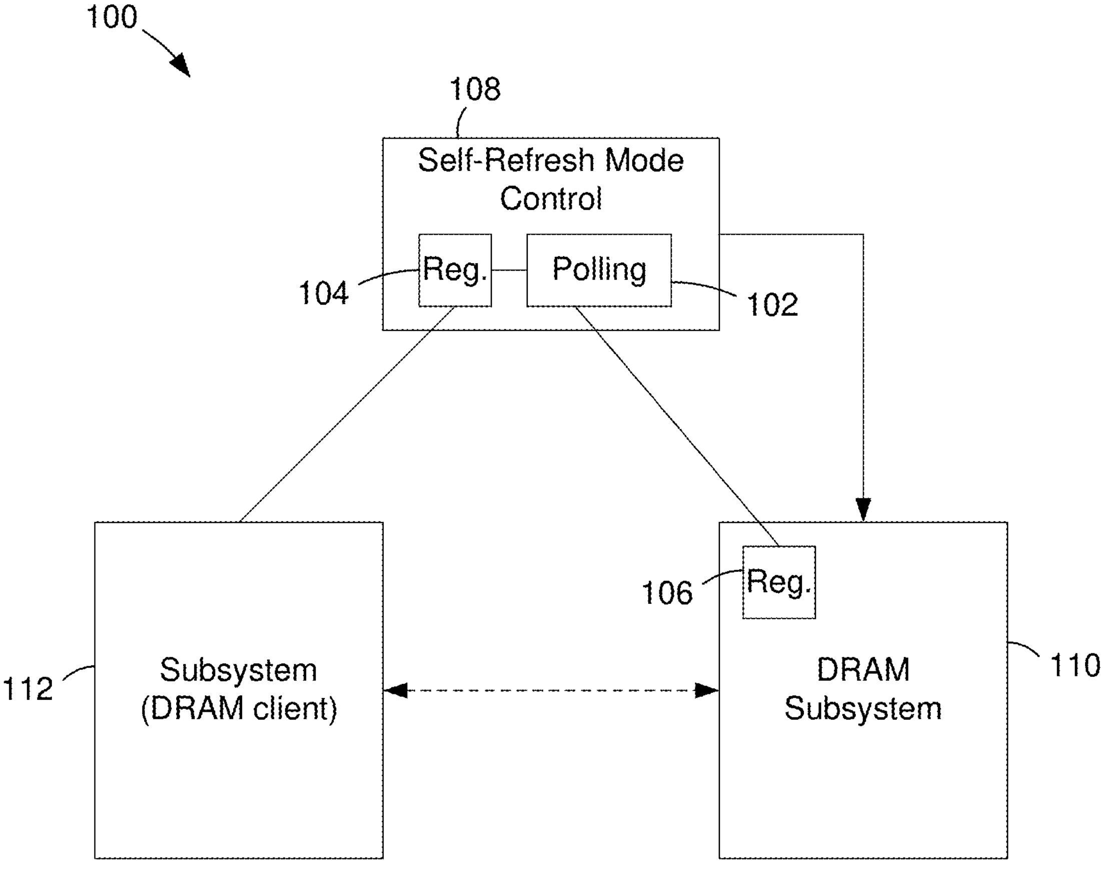
FIG. 1 is a block diagram of a system for managing dynamic random-access memory (DRAM) self-refresh, in accordance with exemplary embodiments.

As shown in FIG. 1, in an illustrative or exemplary embodiment a system 100 for managing dynamic random access memory (DRAM) self-refresh may include polling logic or circuitry 102, a first register 104, and a second register 106. The system 100 may be included in a computing device (not shown), which may be of any type. For example, the system 100 may be included in a desktop or laptop computer, a portable computing device such as a smartphone, an automotive device, an Internet of Things (IoT) device, or a wearable device such as a wristwatch-style device, eyewear, a headset, etc.

The first register 104 may be included in, for example, self-refresh mode control circuitry 108. The self-refresh mode control circuitry 108 may be any type of circuitry whose tasks may include controlling entry into and exit from self-refresh mode by a DRAM subsystem 110. The second register 106 may be included in, for example, the DRAM subsystem 110. Nevertheless, in other examples (not shown) such registers may be included in or otherwise associated with other components.

The registers 104 and 106 may be configured to store one or more indications of DRAM subsystem write activity. Write activity may include any phase of a write transaction between the DRAM subsystem 110 and another subsystem 112 (i.e., a memory transaction client of the DRAM subsystem 110). Write activity may include instances when the DRAM client subsystem 112 has completed its involvement in the write transaction yet the DRAM subsystem 110 has not completed storing all of the data associated with the write transaction. It should be noted that the term "data" in this context (and except where stated otherwise herein) may include both data and metadata that is associated with that data. Benefits of the solutions described herein may include, for example, preventing the self-refresh mode control circuitry 108 from putting the DRAM subsystem 110 into self-refresh mode after data has been stored in the DRAM subsystem 110 but the associated metadata has not yet been stored in the DRAM subsystem 110 and, conversely, from putting the DRAM subsystem 110 into self-refresh mode after metadata has been stored in the DRAM subsystem 110 but the associated data has not yet been stored in the DRAM subsystem 110.

The first register 104 may be configured to receive an indication of DRAM subsystem write activity from the DRAM client subsystem 112. For example, the DRAM client subsystem 112 may store such an indication in the first register 104 when the DRAM client subsystem 112 is about to initiate a write transaction with the DRAM subsystem 110. The DRAM client subsystem 112 may erase or otherwise invalidate such an indication from the first register 104 when the DRAM client subsystem 112 has completed its involvement in the write transaction, i.e., when from the perspective of the DRAM client subsystem 112 the write transaction has been completed.

The second register 106 may be configured to receive an indication of DRAM subsystem write activity from, for example, a DRAM controller (not shown in FIG. 1 for purposes of clarity) of the DRAM subsystem 110. For example, the DRAM controller may store such an indication in the second register 106 while the DRAM controller is responding to the write transaction initiated by the DRAM client subsystem 112, which may include storing the data, storing metadata associated with the data, etc. The DRAM controller may erase or otherwise invalidate such an indication from the second register 106 when the DRAM subsystem 110 has completed storing the data and any associated metadata.

The polling circuitry 102 may be configured to detect initiation of entry into DRAM self-refresh mode. In response to certain conditions or events, a component of the computing device (not shown) having the system 100 may initiate entry into DRAM self-refresh mode. For example, a power-management component (not shown) may determine that under the then-current operating conditions, saving power is of higher priority than processing performance. Accordingly, the power-management component may select a low-power state, in which the DRAM subsystem 110 is placed in self-refresh mode. Such a low-power state may be referred to as a "sleep" state, from which subsystems are "awakened" when the power-management component determines saving power is no longer of higher priority than processing performance. The self-refresh mode control circuitry 108 may be configured to detect a signal or message from such a power-management component requesting the low-power state and, in response, initiate entry of the DRAM subsystem into self-refresh mode. The polling circuitry 102 may be configured to detect such initiation of entry into DRAM self-refresh mode, either directly from the self-refresh mode control circuitry 108 or indirectly from another component.

Entry into a low-power mode or sleep state is an example of a condition or event in response to which DRAM self-refresh mode may be initiated. Another example of such a condition or event may be an abnormal reset or a fault. If a processing system encounters a processing exception or fault, logic or circuitry for handling such events may initiate a system reset. The self-refresh mode control circuitry 108 may be configured to detect such an abnormal reset, fault, etc., and in response may place the DRAM subsystem 110 in self-refresh mode while the system resets. The polling circuitry 102 of the self-refresh mode control circuitry 108 may be configured to detect such initiation of entry into DRAM self-refresh mode, either directly from the self-refresh mode control circuitry 108 or indirectly from another component.

Once the self-refresh mode control circuitry 108 initiates entry into DRAM self-refresh mode, the self-refresh mode control circuitry 108 may control or manage one or more phases or aspects of entry into DRAM self-refresh mode before allowing or enabling the DRAM subsystem 110 to enter self-refresh mode. In one aspect, the polling circuitry 102 may further be configured to poll the registers 104 and 106, beginning after (i.e., in response to) the polling circuitry 102 detects initiation of entry into DRAM self-refresh mode. The polling circuitry 102 may be configured to prevent or defer entry into DRAM self-refresh mode so long as either register 104 or 106 indicates that the DRAM subsystem 110 is still experiencing write activity. Stated conversely, the polling circuitry 102 may be configured to allow or enable entry into DRAM self-refresh mode when both of the registers 104 and 106 indicate that the DRAM subsystem 110 is no longer experiencing write activity.

Figure 2:
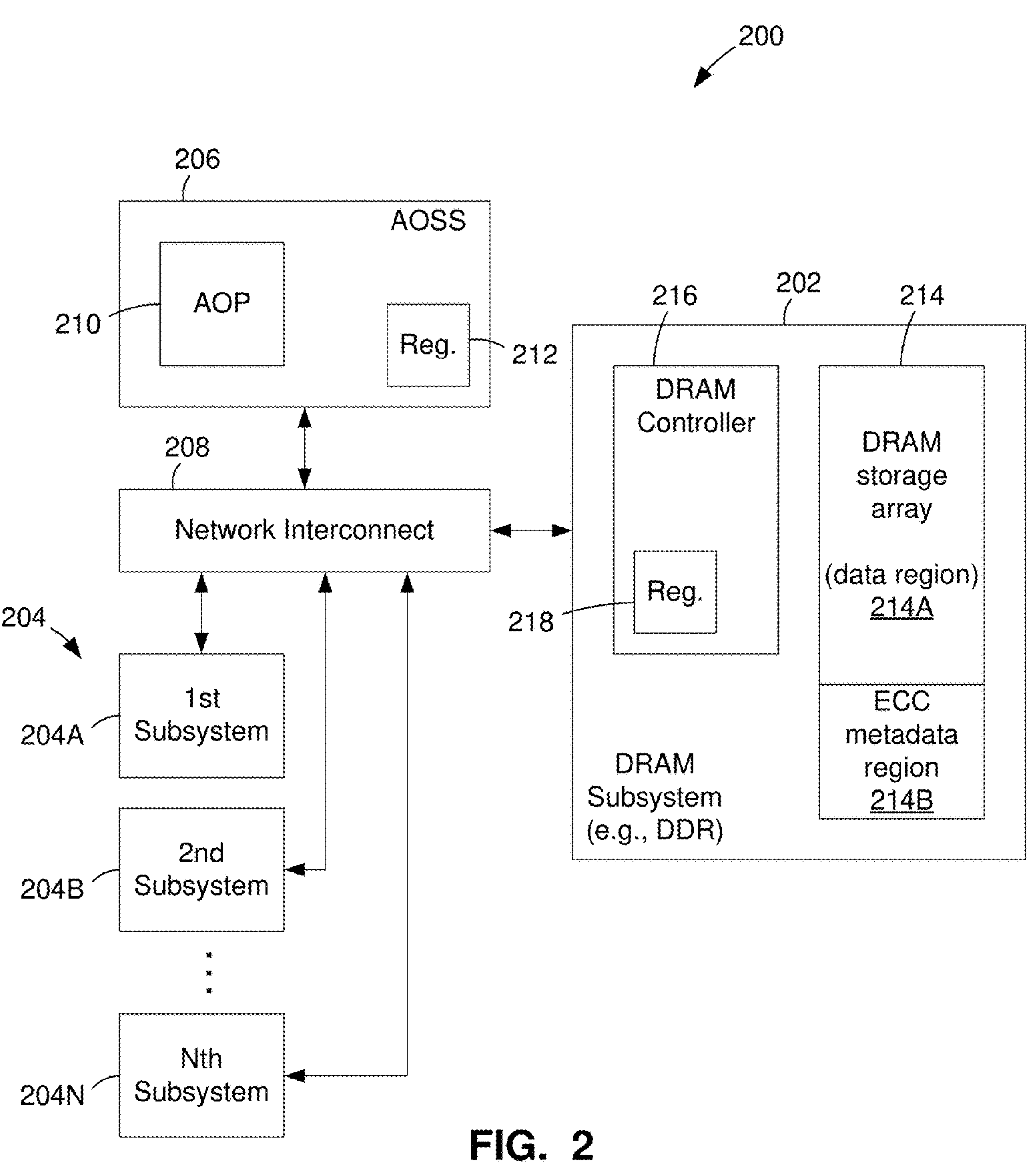
FIG. 2 is a block diagram of another system for managing DRAM self-refresh, in accordance with exemplary embodiments.

In FIG. 2, another system 200 for managing DRAM self-refresh is shown. The system 200 may be an example of the above-described system 100 (FIG. 1). Accordingly, the system 200 may be included in a computing device (not shown) and may include a DRAM subsystem 202 and any number of subsystems 204 that are clients of the DRAM subsystem 202, i.e., that conduct memory transactions with the DRAM subsystem 202, such as a first subsystem 204A, a second subsystem 204B, etc., through an Nth subsystem 204N. The DRAM subsystem 202 may be of any type, such as, for example, a double data-rate synchronous DRAM or "DDR-SDRAM" (sometimes referred to for brevity as "DDR").

The system 200 may also include an "always-on" subsystem (AOSS) 206, so named because even when the computing device is in its lowest power state or sleep state, the AOSS 206 or some portion thereof may remain powered. The AOSS 206 may be configured to perform various tasks, and among these tasks are controlling entry of the DRAM subsystem 202 into self-refresh mode and exit of the DRAM subsystem 202 from self-refresh mode. The DRAM subsystem 202, any one of the subsystems 204, and the AOSS 206 may be examples of the above-described DRAM subsystem 110, the subsystem 112, and the self-refresh mode control logic or circuitry 108. Although in the exemplary system 200 the AOSS 206 controls entry into DRAM self-refresh mode, it should be understood that power aspects of the AOSS 206 (e.g., remaining powered in a sleep state in which other components may be unpowered) are not directly relevant to the solutions described herein. The system 200 may also include a network interconnect 208 (e.g., one or more busses, etc.) configured to provide data communications among the DRAM subsystem 202, the subsystems 204, and the AOSS 206.

The AOSS 206 may include an AO processor (AOP) 210, which may be configured (e.g., through execution of software or firmware) to control aspects of the solutions described herein. For example, the AOP 210 may control the aspects of operation described above with regard to the polling logic or circuitry 102 (FIG. 1). The AOSS 206 may also include a first register 212, which may be an example of the above-described register 104 (FIG. 1). The DRAM subsystem 202 may include a DRAM storage array 214 and a DRAM controller 216. The DRAM controller 216 or associated logic or circuitry may include a second register 218, which may be an example of the above-described register 106 (FIG. 1).

For some types of write transactions initiated by a subsystem 204, the DRAM controller 216 must not only write the data that is the subject of the transaction to the storage array 214 but also generate error-correcting code (ECC) metadata associated with that data and write that metadata to the storage array 214. The storage array 214 may be configured into a data region 214A in which the data are stored, and an ECC metadata region 214B, in which the associated ECC metadata are stored. In some instances, these operations may lead to a race condition. For example, there may be a condition or scenario in which the DRAM controller 216 has completed calculating the ECC metadata and writing it to the ECC metadata region 214B but has not yet completed writing the associated data to the data region 214A when the AOP 210 places the DRAM subsystem 202 into self-refresh mode. It should be understood that although in the exemplary system 200 the DRAM controller 216 generates the ECC metadata, in other examples (not shown) such metadata may be generated by another component, such as a co-processor. In still other examples the subsystem 204 may provide both the data and associated metadata.

In an example of operation of the system 200, the computing device (not shown) may experience an abnormal reset and, as part of a response to the abnormal reset event, attempt to save or dump data before resetting the various computing device subsystems. Such a reset event may initiate entry of the DRAM subsystem 202 into self-refresh mode. The DRAM subsystem 202 may then enter self-refresh mode. The AOP 210 may be configured to detect such initiation of entry into self-refresh mode and then temporarily bring the DRAM subsystem 202 out of self-refresh mode so that a data dump from the subsystems 204 may be performed. The AOP 210 may subsequently place the DRAM subsystem 202 back into self-refresh mode after the data dump has been completed.

Figure 3:
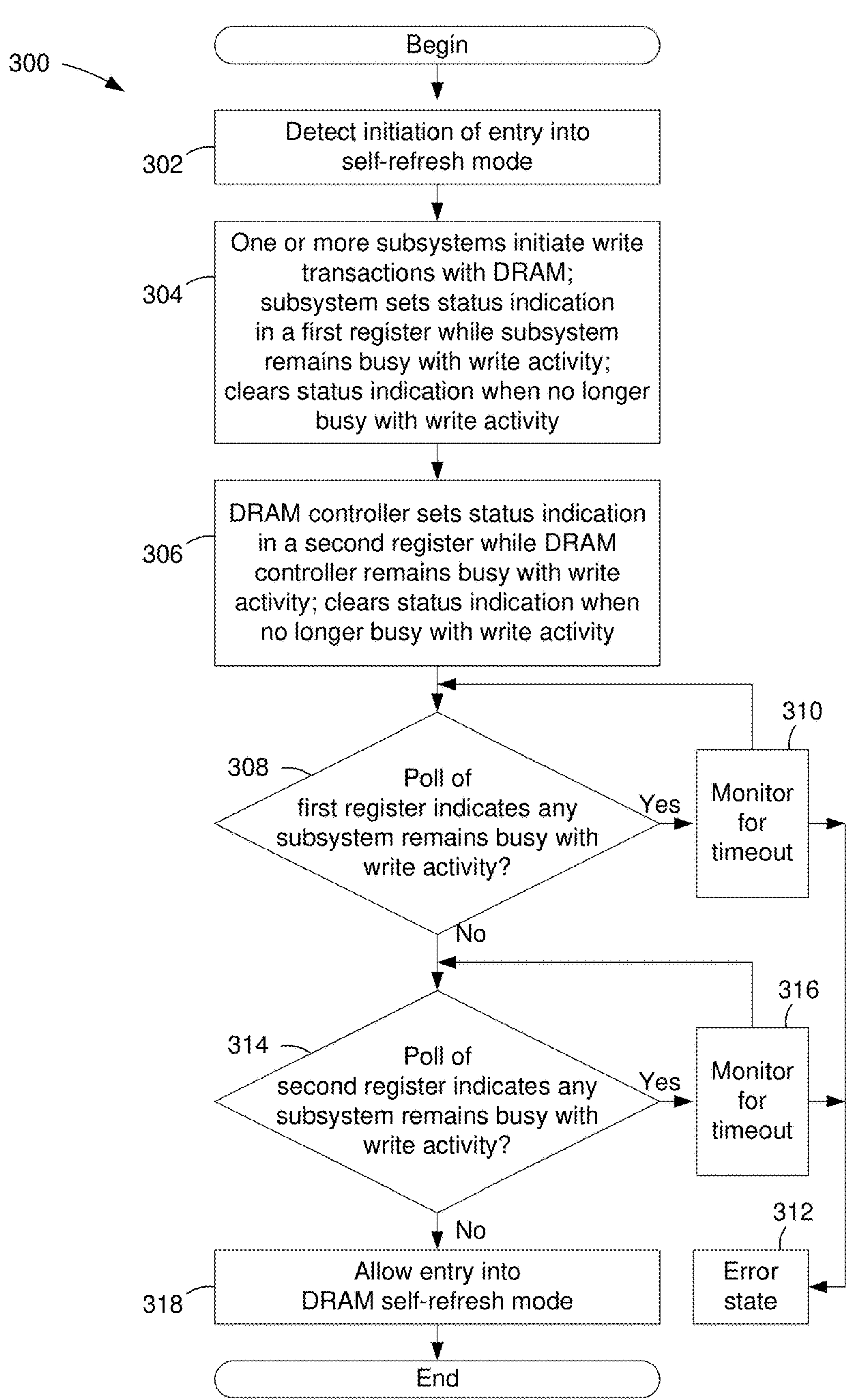
FIG. 3 is a flow diagram illustrating a method for managing DRAM self-refresh, in accordance with exemplary embodiments.

In FIG. 3, a method 300 for managing DRAM self-refresh mode is illustrated in flow diagram form. Although the method 300 is described in the form of blocks indicating various operations in an order conducive to understanding an example, it should be understood that operations may be combined or split, may occur in other orders or concurrently, may be omitted in whole or part, or may be combined with additional operations not described herein.

As indicated by block 302, initiation of entry into DRAM self-refresh mode may be detected. As described below, initiation of entry into DRAM self-refresh mode may trigger further operations. For example, the AOP 210 (FIG. 2) may detect initiation of DRAM entry into self-refresh mode and, in response, begin polling the registers 212 and 218 as described below.

As indicated by block 304, one of more subsystems may initiate write transactions with a DRAM. In the example of operation described above with regard to FIG. 2, relating to a data dump, each of the subsystems 204 may initiate write transactions with the DRAM subsystem 202. Referring briefly again to FIG. 2, the first register 212 is configured to be accessible to the subsystems 204 through the network interconnect 208. Before a subsystem 204 begins the write transaction, the subsystem 204 may set a status indication in the first register 212 to a "Busy" state or indication. The status indication may remain set to Busy while the subsystem 204 remains busy with the write transaction. When the subsystem 204 has completed its participation in the write transaction, i.e., the subsystem 204 is no longer busy with the transaction, the subsystem 204 may reset the status indication in the first register 212 from the Busy state or indication to an "Idle" state or indication. Each of the one or more subsystems 204 may operate in the aforementioned manner with regard to indicating its status using the first register 212.

As indicated by block 306 (FIG. 3), a status indication, indicating whether the DRAM subsystem 202 (FIG. 2) is busy storing data (which may include storing metadata) in the storage array 214, may be set. For example, the DRAM controller 216 may set a status indication in the second register 218 to Busy. The status indication may remain set to Busy while the DRAM controller 216 remains busy with the write transaction. When the DRAM controller 216 has completed its participation in the write transaction, i.e., all of the data and metadata associated with the transaction has been stored in the storage array 214, the DRAM controller 216 may reset the status indication in the second register 218 from Busy to Idle.

As indicated by block 308 (FIG. 3), the first register 212 (FIG. 2) may be polled periodically. For example, the AOP 210 may poll the first register 212. When the AOP 210 begins polling, the AOP 210 may initially prevent (i.e., not allow or enable) the DRAM subsystem 202 from entering self-refresh mode. So long as the poll of the first register 212 continues to indicate that one or more of the subsystems 204 remain busy with write activity, the AOP 210 may continue to periodically poll the first register 212.

As indicated by block 310, the AOP 210 may perform timeout monitoring while polling the first register 212. The timeout monitoring may comprise timing a time interval beginning when initiation of entry into self-refresh mode is detected. So long as the time interval does not expire, the AOP 210 may continue polling the first register 212. In other words, the AOP 210 may determine whether the status indicated by polling the first register 212 changes from Busy to Idle before expiration of a time interval. If the time interval expires before the status indicated by polling the first register 212 changes from Busy to Idle (i.e., indicating absence of DRAM subsystem write activity), an error state may be entered, as indicated by block 312. Note that in the error state, the AOP 210 has not allowed or enabled the DRAM subsystem 202 to enter self-refresh mode.

If the subsystem write activity status indicated by polling (block 308) the first register 212 changes from Busy to Idle before expiration of the time interval, then it may be determined whether the DRAM write activity status indicated by polling the second register 218 changes from Busy to Idle. As indicated by block 314, the second register 218 may be polled periodically in a manner similar to the above-described periodic polling of the first register 212. For example, AOP 210 may poll the second register 218. So long as the poll of the second register 218 continues to indicate that the DRAM subsystem 202 remains busy with write activity, the AOP 210 may continue to periodically poll the second register 218.

As indicated by block 316, the AOP 210 may perform timeout monitoring while it continues to poll the second register 218. The timeout monitoring may comprise timing a time interval beginning when initiation of entry into self-refresh mode is detected. So long as the time interval does not expire, the AOP 210 may continue polling the second register 218. In other words, the AOP 210 may determine whether the status indicated by polling the second register 218 changes from Busy to Idle before expiration of a time interval. The (second) time interval in the timeout operation indicated by block 316 need not be the same as the above-described (first) time interval in the timeout operation indicated by block 310. If this second time interval expires before the status indicated by polling the second register 218 changes from Busy to Idle (i.e., indicating absence of DRAM subsystem write activity), the above-described error state indicated by block 312 may be entered.

If the subsystem write activity status indicated by polling (block 308) the first register 212 changes from Busy to Idle before expiration of the first time interval, and the DRAM write activity status indicated by polling (block 314) the second register 218 changes from Busy to Idle before expiration of the second time interval, then the AOP 210 may allow or enable the DRAM subsystem 202 to enter self-refresh mode, as indicated by block 318.

Although not shown in FIG. 3, the DRAM subsystem 202 may remain in self-refresh mode for some amount of time and then exit from self-refresh mode. The solutions described herein may mitigate potential problems such as a mismatch between data and associated ECC metadata in the DRAM subsystem 202 upon exit from self-refresh mode.

Figure 4:
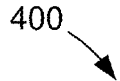
FIG. 4 is a data diagram illustrating a register configuration to indicate DRAM client subsystem memory transaction status, in accordance with exemplary embodiments.
Figure 4:
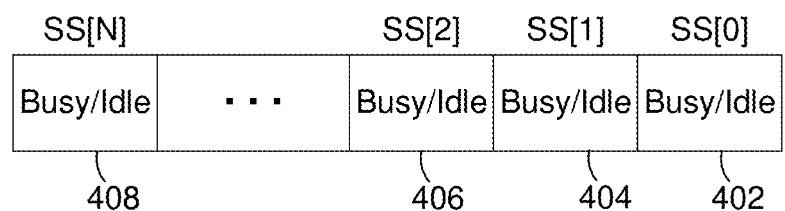

In FIG. 4, a register 400 is shown, which may be an example of the above-described first register 104 (FIG. 1) or first register 212 (FIG. 2). The register 400 may be configured to store indications of the status (i.e., a single bit indicating Busy or Idle) of any number of subsystem (SS) that are DRAM clients: a first bit 402 of the register 400 may be configured to store the status SS[0] of a first subsystem; a second bit 404 of the register 400 may be configured to store the status SS[1] of a second subsystem; a third bit 406 of the register 400 may be configured to store the status SS[2] of a third subsystem, etc., through an Nth bit 408 of the register 500, which may be configured to store the status SS[N] of an (N+1)th subsystem. That is, each DRAM client subsystem may access a corresponding bit of the register 400 and set its status to one of two states: Busy or Idle. For example, the Busy state may be represented by a "1" bit and the Idle state may be represented by a "0" bit. The polling logic 104 (FIG. 1) or the AOP 210 (FIG. 2) may poll the register 400. If any of the bits of the register 400 indicate that a subsystem is Busy, the DRAM subsystem may be prevented from entering self-refresh mode.

Figure 5:
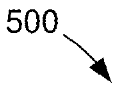
FIG. 5 is a data diagram illustrating a register configuration to indicate DRAM subsystem activity status, in accordance with exemplary embodiments.
Figure 5:
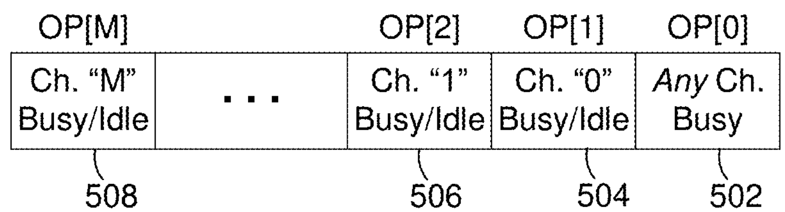

In FIG. 5, a register 500 is shown which may be an example of the above-described second register 106 (FIG. 1) or second register 218 (FIG. 2). The register 500 may be configured to store an operand "OP[M:0]" comprising indications of the status of any number of DRAM subsystem channels. A first bit 502 of the register 500 may be configured to store an indication of the overall status OP[0] of the DRAM subsystem. That is, the DRAM subsystem may access the first bit 502 and set its status to one of two states: Busy or Idle. So long as the DRAM subsystem has not yet completed storing all of the data (including metadata) associated with a write transaction, the state of the first bit 502 may remain set to Busy. When the DRAM subsystem has completed storing all of the data (including metadata) associated with a write transaction, the DRAM subsystem may set the state of the first bit 502 to Idle.

The remaining bits of the register 500 may be configured to store indications of the status of individual channels of a DRAM subsystem having multiple channels: a second bit 504 of the register 500 may be configured to store the status OP[1] of a first channel (Ch. "0"); a second bit 506 of the register 500 may be configured to store the status OP[2] of a second channel (Ch. "1"), etc., through an Mth bit 508 of the register 500, which may be configured to store the status OP[M] of an Mth subsystem. So long as a DRAM channel remains in use storing data (including metadata) associated with a write transaction, the state of the corresponding one of the bits 504-508 may remain set to Busy. When that channel is no longer in use storing data (including metadata) associated with the write transaction, the DRAM subsystem may set the state of that one of the bits 504-508 to Idle. Note that the state of the first bit 502 may remain set to Busy so long as any of the channels are in use, i.e., busy, and the state of the first bit 502 may be set to Idle when none of the channels are in use, i.e., all channels are idle. The polling logic 104 (FIG. 1) or the AOP 210 (FIG. 2) may poll the register 500. If the first bit 502 indicates that the overall DRAM subsystem is Busy, the DRAM subsystem may be prevented from entering self-refresh mode. In addition, or alternatively, if any of the bits 504-508 indicate that one or more channels of the DRAM subsystem are Busy, the DRAM subsystem may be prevented from entering self-refresh mode. Although this operation may rely on the first bit 502 alone and does not require polling the remaining bits 504-508, the remaining bits 504-508 may be useful for other purposes, such as for debugging or for optimizations of the methods described herein.

Figure 6:
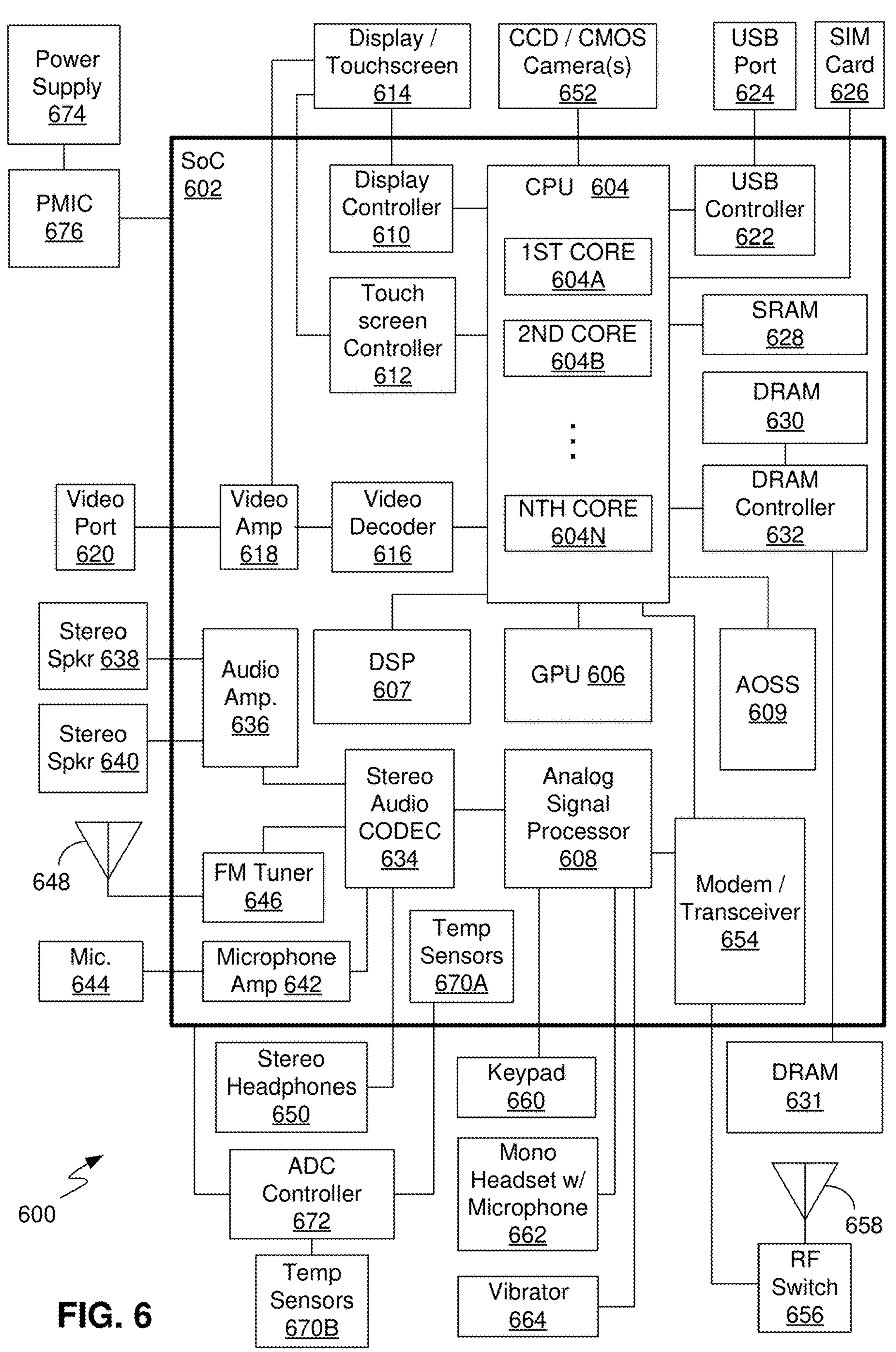
FIG. 6 is a block diagram of a computing device in which systems, methods and other examples of managing DRAM self-refresh may be provided, in accordance with exemplary embodiments.

FIG. 6 illustrates an example of a portable computing device (PCD) 600, in which exemplary embodiments of systems, methods, and other examples of managing DRAM self-refresh may be provided. The PCD 600 may be, for example, a laptop or palmtop computer, cellular telephone or smartphone, personal digital assistant, navigation device, smartbook, portable game console, satellite telephone, automotive device, Internet-of-Things (IoT) device, etc. For purposes of clarity, some data buses, interconnects, signals, etc., are not shown in FIG. 6.

The PCD 600 may include an SoC 602. The SoC 602 may include a CPU 604, a GPU 606, a digital signal processor (DSP) 607, an analog signal processor 608, a modem/modem subsystem 654, or other processors. The CPU 604 may include one or more CPU cores, such as a first CPU core 604A, a second CPU core 604B, etc., through an Nth CPU core 604N. The PCD 600 may also include an AOSS 609.

A display controller 610 and a touch-screen controller 612 may be coupled to the CPU 604. A touchscreen display 614 external to the SoC 602 may be coupled to the display controller 610 and the touch-screen controller 612. The PCD 600 may further include a video decoder 616 coupled to the CPU 604. A video amplifier 618 may be coupled to the video decoder 616 and the touchscreen display 614. A video port 620 may be coupled to the video amplifier 618. A universal serial bus (USB) controller 622 may also be coupled to CPU 604, and a USB port 624 may be coupled to the USB controller 622. A subscriber identity module (SIM) card 626 may also be coupled to the CPU 604.

The CPU 604 may be coupled to one or more memories, with which the CPU 604 may initiate memory transactions. The one or more memories may include both volatile and non-volatile memories. Examples of volatile memories include static random access memory (SRAM) 628 and dynamic random access memories (DRAMs) 630 and 631. Such memories may be internal to the SoC 602, as in the case of the DRAM 630, or external to the SoC, as in the case of the DRAM 631. A DRAM controller 632 coupled to the CPU 604 may control the writing of data to, and reading of data from, the DRAMs 630 and 631. The DRAMs 630 and 631 may have a self-refresh mode.

The CPU 604, GPU 606, DSP 607, analog signal processor 608, modem/modem subsystem 654, or other subsystems may be examples of the above-described DRAM client subsystems 112 (FIG. 1) or 204 (FIG. 2) and, accordingly, may be configured to conduct memory transactions with the DRAMs 630 and 631, which may be examples of the above-described DRAM subsystems 110 (FIG. 1) or 214 (FIG. 2). The AOSS 609 may be an example of the above-described self-refresh mode control circuitry 108 (FIG. 1) or the AOSS 206 (FIG. 2). When an abnormal reset or fault occurs in the PCD 600 or a subsystem or component thereof, or when the PCD 600 or a subsystem or component thereof enters a sleep state, the solutions described herein may help prevents undesirable conditions including, for example, a mismatch between data and associated ECC metadata stored in the DRAMs 630 or 631.

A stereo audio CODEC 634 may be coupled to the analog signal processor 608. Further, an audio amplifier 636 may be coupled to the stereo audio CODEC 634. First and second stereo speakers 638 and 640, respectively, may be coupled to the audio amplifier 636. In addition, a microphone amplifier 642 may be coupled to the stereo audio CODEC 634, and a microphone 644 may be coupled to the microphone amplifier 642. A frequency modulation (FM) radio tuner 646 may be coupled to the stereo audio CODEC 634. An FM antenna 648 may be coupled to the FM radio tuner 646. Further, stereo headphones 650 may be coupled to the stereo audio CODEC 634.

Other devices that may be coupled to the CPU 604 include one or more digital (e.g., CCD or CMOS) cameras 652. An example of real-time operation, to which the D2D link maintenance control solutions described herein may apply, is capturing video images using the cameras 652 and then processing the images as they are captured (i.e., in a real-time or streaming manner) using, for example, the GPU 606 and CPU 604. The methods and systems for controlling a D2D communication link to provide maintenance downtime may be used where, for example, the GPU 606 and CPU 604 are on different dies or chiplets that are coupled by such a D2D link.

The RF transceiver or modem subsystem 654 may be coupled to the analog signal processor 608 and the CPU 604. An RF switch 656 may be coupled to the modem subsystem 654 and an RF antenna 658. In addition, a keypad 660, a mono headset with a microphone 662, and a vibrator device 664 may be coupled to the analog signal processor 608.

The SoC 602 may have one or more internal or on-chip thermal sensors 670A and may be coupled to one or more external or off-chip thermal sensors 670B. An analog-to-digital converter controller 672 may convert voltage drops produced by the thermal sensors 670A and 670B to digital signals. A power supply 674 and a power management integrated circuit (PMIC) 676 may supply power to the SoC 602. The PMIC 676 may be configured to, among other functions, control entry into and exit from sleep states or other low-power states during which the DRAM 630 or 631 may be in self-refresh mode.

Implementation examples are described in the following numbered clauses.

1. A system for managing dynamic random-access memory (DRAM) self-refresh, comprising:
at least one register configured to store at least one indication of DRAM subsystem write activity associated with a DRAM client subsystem; and
polling circuitry configured to detect initiation of DRAM self-refresh mode entry, to poll the at least one register in response to detection of initiation of DRAM self-refresh mode entry, and to prevent entry into DRAM self-refresh mode while the at least one register indicates DRAM subsystem write activity associated with the DRAM client subsystem.

2. The system of clause 1, wherein the at least one register comprises a register in a self-refresh control subsystem, and the first register is configured to receive the indication from the DRAM client subsystem.

3. The system of clause 2, wherein the register is configured to store a plurality of the indications received from a corresponding plurality of DRAM client subsystems, and wherein the polling circuitry is configured to prevent entry into DRAM self-refresh mode while at least one of the plurality of indications indicates DRAM subsystem write activity associated with the DRAM client subsystem.

4. The system of clause 1, wherein the at least one register comprises a register in the DRAM subsystem, and the register is configured to receive the indication from a DRAM controller of the DRAM subsystem.

5. The system of clause 1, wherein the at least one register comprises:
a first register in a self-refresh control subsystem, the first register configured to receive a first indication from the DRAM client subsystem; and
a second register in the DRAM subsystem, the second register configured to receive a second indication from a DRAM controller of the DRAM subsystem;
wherein the polling circuitry is configured to prevent entry into DRAM self-refresh mode while at least one of the first register and the second register indicate DRAM subsystem write activity associated with the DRAM client subsystem.

6. The system of any of clauses 1-5, wherein the polling circuitry comprises a timer configured to begin timing a time interval when initiation of DRAM self-refresh mode entry is detected, and to prevent entry into DRAM self-refresh mode when the time interval expires before the at least one register indicates absence of DRAM subsystem write activity associated with the DRAM client subsystem.

7. The system of any of clauses 1-6, wherein the DRAM subsystem write activity associated with the DRAM client subsystem comprises writing error-correcting code (ECC) metadata or writing data associated with the ECC metadata.

8. A method for managing dynamic random-access memory (DRAM) self-refresh, comprising:
storing, by at least one register, at least one indication of DRAM subsystem write activity associated with a DRAM client subsystem; and detecting, by polling circuitry, initiation of DRAM self-refresh mode entry;

polling, by the polling circuitry, the at least one register in response to detection of initiation of DRAM self-refresh mode entry; and preventing entry into DRAM self-refresh mode while the at least one register indicates DRAM subsystem write activity associated with the DRAM client subsystem.

9. The method of clause 8, wherein the at least one register comprises a register in a self-refresh control subsystem, and the register is configured to receive the indication from the DRAM client subsystem.

10. The method of clause 9, wherein:

storing at least one indication comprises storing a plurality of indications received from a corresponding plurality of DRAM client subsystems;

preventing entry into DRAM self-refresh mode comprises preventing entry into DRAM self-refresh mode while at least one of the plurality of indications indicates DRAM subsystem write activity associated with the DRAM client subsystem.

11. The method of clause 8, wherein the at least one register comprises a register in the DRAM subsystem, and the register is configured to receive the indication from a DRAM controller of the DRAM subsystem.

12. The method of clause 8, wherein the at least one register comprises:

a first register in a self-refresh control subsystem, the first register configured to receive a first indication from the DRAM client subsystem; and a second register in the DRAM subsystem, the second register configured to receive a second indication from a DRAM controller of the DRAM subsystem.

13. The method of any of clauses 8-12, further comprising:

timing a time interval beginning when initiation of DRAM self-refresh mode entry is detected; and preventing entry into DRAM self-refresh mode when the time interval expires before the at least one register indicates absence of DRAM subsystem write activity associated with the DRAM client subsystem.

14. The method of any of clauses 8-13, wherein the DRAM subsystem write activity associated with the DRAM client subsystem comprises writing error-correcting code (ECC) metadata or writing data associated with the ECC metadata.

15. A system for managing dynamic random-access memory (DRAM) self-refresh, comprising:

means for storing at least one indication of DRAM subsystem write activity associated with a DRAM client subsystem; and means for detecting initiation of DRAM self-refresh mode entry;

means for polling the at least one register in response to detection of initiation of DRAM self-refresh mode entry; and means for preventing entry into DRAM self-refresh mode while the means for storing indicates DRAM subsystem write activity associated with the DRAM client subsystem.

16. The system of clause 15, wherein the means for storing at least one indication comprises a register in a self-refresh control subsystem, and the register is configured to receive the indication from the DRAM client subsystem.

17. The system of clause 16, wherein:

the means for storing at least one indication comprises means for storing a plurality of indications received from a corresponding plurality of DRAM client subsystems; and the means for preventing entry into DRAM self-refresh mode comprises means for preventing entry into DRAM self-refresh mode while at least one of the plurality of indications indicates DRAM subsystem write activity associated with the DRAM client subsystem.

18. The system of clause 15, wherein the means for storing at least one indication comprises a means for storing an indication in the DRAM subsystem, and the means for storing an indication is configured to receive the indication from a DRAM controller of the DRAM subsystem.

19. The system of clause 15, wherein the means for storing at least one indication comprises:

means for storing a first indication in a self-refresh control subsystem, the first means for storing configured to receive the first indication from the DRAM client subsystem; and means for storing a second indication in the DRAM subsystem, the means for storing a second indication configured to receive the second indication from a DRAM controller of the DRAM subsystem.

20. The system of any of clauses 15-19, further comprising:

means for timing a time interval beginning when initiation of DRAM self-refresh mode entry is detected; and the means for preventing entry into DRAM self-refresh mode comprises means for preventing entry into DRAM self-refresh mode when the time interval expires before the means for storing the indication indicates absence of DRAM subsystem write activity associated with the DRAM client subsystem.

Alternative embodiments will become apparent to one of ordinary skill in the art to which the invention pertains. Therefore, although selected aspects have been illustrated and described in detail, it will be understood that various substitutions and alterations may be made therein.

What is claimed is:

1. A system for managing dynamic random-access memory (DRAM) self-refresh, comprising:

at least one register configured to store at least one indication of DRAM subsystem write activity associated with a DRAM client subsystem; and polling circuitry configured to detect initiation of DRAM self-refresh mode entry, to poll the at least one register in response to detection of initiation of DRAM self-refresh mode entry, and to prevent entry into DRAM self-refresh mode while the at least one register indicates DRAM subsystem write activity associated with the DRAM client subsystem, wherein the polling circuitry comprises a timer configured to begin timing a time interval when initiation of DRAM self-refresh mode entry is detected, and to prevent entry into DRAM self-refresh mode when the time interval expires before the at least one register indicates absence of DRAM subsystem write activity associated with the DRAM client subsystem.

2. The system of claim 1, wherein the at least one register comprises a register in a self-refresh control subsystem, and the register is configured to receive the indication from the DRAM client subsystem.

3. The system of claim 2, wherein the register is configured to store a plurality of the indications received from a corresponding plurality of DRAM client subsystems, and wherein the polling circuitry is configured to prevent entry into DRAM self-refresh mode while at least one of the plurality of indications indicates DRAM subsystem write activity associated with the DRAM client subsystem.

4. The system of claim 1, wherein the at least one register comprises a register in the DRAM subsystem, and the register is configured to receive the indication from a DRAM controller of the DRAM subsystem.

5. The system of claim 1, wherein the at least one register comprises:

a first register in a self-refresh control subsystem, the first register configured to receive a first indication from the DRAM client subsystem; and a second register in the DRAM subsystem, the second register configured to receive a second indication from a DRAM controller of the DRAM subsystem;

wherein the polling circuitry is configured to prevent entry into DRAM self-refresh mode while at least one of the first register and the second register indicate DRAM subsystem write activity associated with the DRAM client subsystem.

6. The system of claim 1, wherein the DRAM subsystem write activity associated with the DRAM client subsystem comprises writing error-correcting code (ECC) metadata or writing data associated with the ECC metadata.

7. A method for managing dynamic random-access memory (DRAM) self-refresh, comprising:

storing, by at least one register, at least one indication of DRAM subsystem write activity associated with a DRAM client subsystem; and detecting, by polling circuitry, initiation of DRAM self-refresh mode entry;

polling, by the polling circuitry, the at least one register in response to detection of initiation of DRAM self-refresh mode entry;

preventing entry into DRAM self-refresh mode while the at least one register indicates DRAM subsystem write activity associated with the DRAM client subsystem;

timing a time interval beginning when initiation of DRAM self-refresh mode entry is detected; and preventing entry into DRAM self-refresh mode when the time interval expires before the at least one register indicates absence of DRAM subsystem write activity associated with the DRAM client subsystem.

8. The method of claim 7, wherein the at least one register comprises a register in a self-refresh control subsystem, and the register is configured to receive the indication from the DRAM client subsystem.

9. The method of claim 8, wherein:

storing at least one indication comprises storing a plurality of indications received from a corresponding plurality of DRAM client subsystems;

preventing entry into DRAM self-refresh mode comprises preventing entry into DRAM self-refresh mode while at least one of the plurality of indications indicates DRAM subsystem write activity associated with the DRAM client subsystem.

10. The method of claim 7, wherein the at least one register comprises a register in the DRAM subsystem, and the register is configured to receive the indication from a DRAM controller of the DRAM subsystem.

11. The method of claim 7, wherein the at least one register comprises:

a first register in a self-refresh control subsystem, the first register configured to receive a first indication from the DRAM client subsystem; and a second register in the DRAM subsystem, the second register configured to receive a second indication from a DRAM controller of the DRAM subsystem.

12. The method of claim 7, wherein the DRAM subsystem write activity associated with the DRAM client subsystem comprises writing error-correcting code (ECC) metadata or writing data associated with the ECC metadata.

13. A system for managing dynamic random-access memory (DRAM) self-refresh, comprising:

means for storing at least one indication of DRAM subsystem write activity associated with a DRAM client subsystem; and means for detecting initiation of DRAM self-refresh mode entry;

means for polling the means for storing in response to detection of initiation of DRAM self-refresh mode entry;

means for preventing entry into DRAM self-refresh mode while the means for storing indicates DRAM subsystem write activity associated with the DRAM client subsystem;

means for timing a time interval beginning when initiation of DRAM self-refresh mode entry is detected; and the means for preventing entry into DRAM self-refresh mode comprises means for preventing entry into DRAM self-refresh mode when the time interval expires before the means for storing the indication indicates absence of DRAM subsystem write activity associated with the DRAM client subsystem.

14. The system of claim 13, wherein the means for storing at least one indication comprises a register in a self-refresh control subsystem, and the register is configured to receive the indication from the DRAM client subsystem.

15. The system of claim 14, wherein:

the means for storing at least one indication comprises means for storing a plurality of indications received from a corresponding plurality of DRAM client subsystems; and the means for preventing entry into DRAM self-refresh mode comprises means for preventing entry into DRAM self-refresh mode while at least one of the plurality of indications indicates DRAM subsystem write activity associated with the DRAM client subsystem.

16. The system of claim 13, wherein the means for storing at least one indication comprises a means for storing an indication in the DRAM subsystem, and the means for storing an indication is configured to receive the indication from a DRAM controller of the DRAM subsystem.

17. The system of claim 13, wherein the means for storing at least one indication comprises:

means for storing a first indication in a self-refresh control subsystem, the first means for storing configured to receive the first indication from the DRAM client subsystem; and means for storing a second indication in the DRAM subsystem, the means for storing a second indication configured to receive the second indication from a DRAM controller of the DRAM subsystem.

* * * * *